United States Patent [19]

Tolle et al.

[11] Patent Number: 4,971,570

[45] Date of Patent: Nov. 20, 1990

[54] WEDGE CLAMP THERMAL CONNECTOR

[75] Inventors: Michael C. Tolle, Menlo Park, Calif.; Wesley E. Bartholomew, Layton, Utah; Charles P. Minning, S. Pasadena, Calif.

[73] Assignee: Hughes Aircraft Company, Los Angeles, Calif.

[21] Appl. No.: 401,333

[22] Filed: Aug. 31, 1989

[51] Int. Cl.⁵ .................... H01R 13/639; H05K 7/20
[52] U.S. Cl. ...................................... 439/327; 361/388
[58] Field of Search .......................... 439/64, 325, 327; 361/386, 388, 415; 165/80.2, 185; 211/41

[56] References Cited

U.S. PATENT DOCUMENTS 3,767,058 10/1973 Barlow et al. ..................... 211/41
3,820,592 6/1974 Lander ............................... 165/185
4,157,583 6/1979 Basmajian ........................... 361/399
4,480,287 10/1984 Jensen ................................ 361/388
4,821,147 4/1989 Jacobs ................................ 211/41

Primary Examiner—Neil Abrams
Attorney, Agent, or Firm—Leonard A. Alkov; Wanda K. Denson-Low

[57] ABSTRACT

The wedge clamp (28) engages on the end of a heatsink (18) and engages within a channel shaped recess (24, 26) in the coldwall. The wedge clamp (28) is made up of a pair of wedges (32, 34) of the same angle driven together by a screw (48). This forces the wedge clamp surfaces (32, 34) apart to obtain a large heat transfer area and intimate contact with the coldwall surfaces (24, 26).

8 Claims, 2 Drawing Sheets

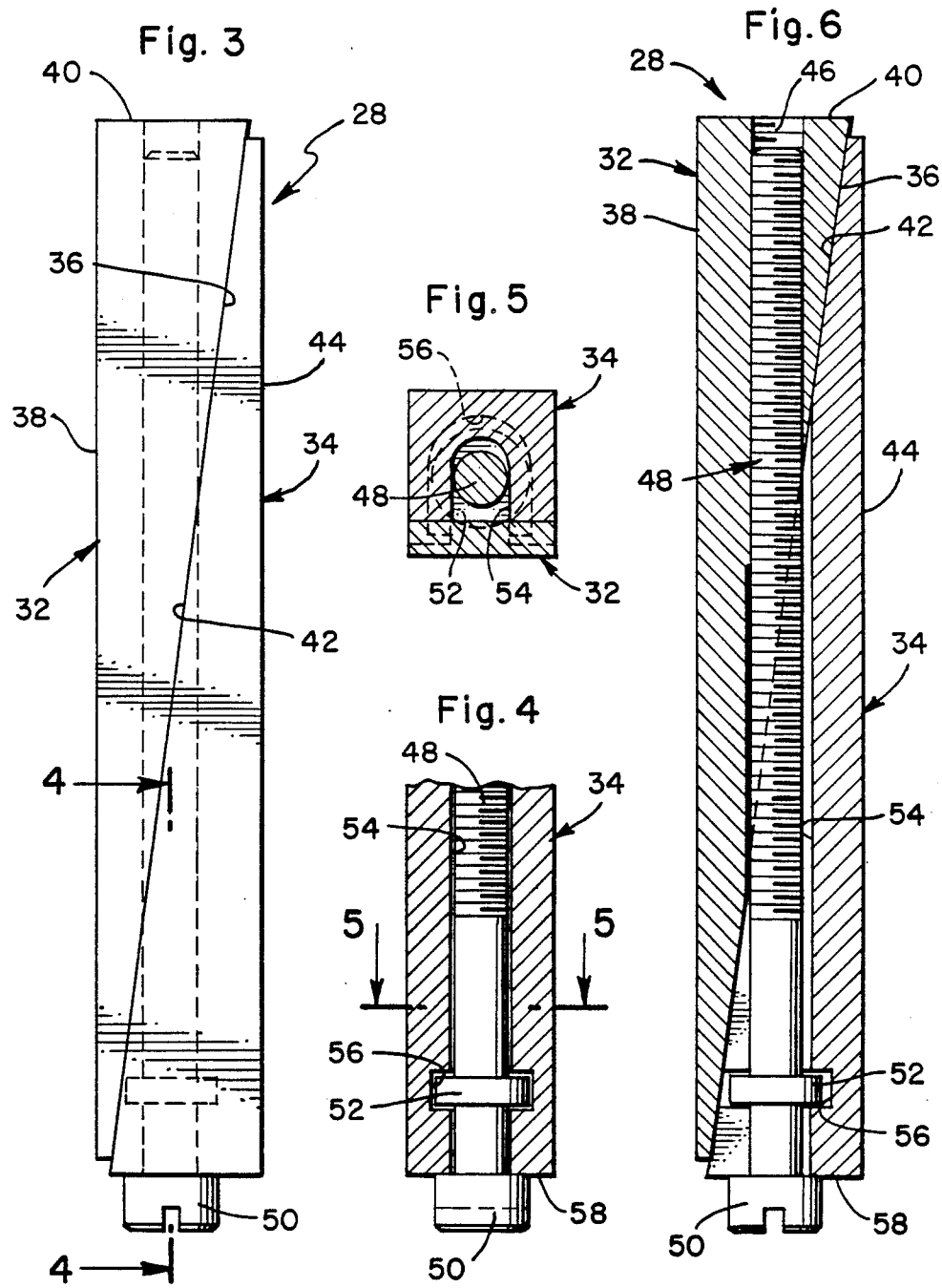

4,971,570

WEDGE CLAMP THERMAL CONNECTOR

FIELD OF THE INVENTION

This invention is directed to a clamp for strongly and intimately clamping a heatsink into a U-shaped channel in a coldwall.

BACKGROUND OF THE INVENTION

In order to achieve efficient heat transfer with minimum temperature drop between the heatsink and coldwall, adjacent parts, intimate, large area mechanical contact is necessary. In an attempt to also accommodate for dimensional changes over a temperature range, some previous devices incorporated therein fairly thin resilient sheet stock formed to act as a spring as well as a thermally conductive member. Such devices have narrow cross sections and have small contact areas with low interface clamping force that limits heat transfer. In order to achieve maximized heat transfer, there is need for a high pressure, optimum clamp structure.

SUMMARY OF THE INVENTION

In order to aid in the understanding of this invention, it can be stated in essentially summary form that it is directed to a wedge clamp thermal connector wherein two wedges have equal wedge angles and have planar contact faces in contact with each other. The outward facing surfaces of the wedges are planar clamp faces which ar parallel to each other. The contact faces and clamp faces are nearly the same length due to the shallow wedge angle. A screw interengages between the wedges to force them to slide relative to each other and increase the distance between the clamp faces.

It is thus a purpose and advantage of this invention to provide a wedge clamp thermal connector which has thermal contact faces of large area with firm clamp structure to maintain the faces in good thermal contact with the coldwall.

It is another purpose and advantage of this invention to provide a wedge clamp for use as a thermal conductor wherein the wedge clamp is inexpensive to manufacture and is easy to use, but is of reliable, low thermal resistance configuration.

Other purposes and advantages of this invention will become apparent from a study of the following portion of this specification, the claims and the attached drawings wherein:

BRIEF DESCRIPTION OF THE DRAWINGS

FIG. 3 is a enlarged view of the wedge clamp thermal connector as seen in FIG. 2.

FIG. 4 is enlarged section taken generally along the line 4—4 of FIG. 3.

FIG. 5 is a section taken generally along the line 5—5 of FIG. 4.

FIG. 6 is a substantially central longitudinal section through the wedge clamp thermal connector as seen in the orientation of FIG. 3.

DESCRIPTION OF THE PREFERRED EMBODIMENT

Printed wiring boards carry thereon electronic components which become heated by the electric current passing therethrough. The temperatures of such components must be limited or failure will occur. The wedge clamp thermal connector of this invention is a portion of the system for removing heat from such components. As an example, printed wiring boards 10 and 12 carry components 14 and 16 thereon. The printed wiring boards are continuously bonded to opposite sides of heatsink 18. The components are mounted on the printed wiring boards in such a manner as to maximize heat transfer from the components through the printed wiring board, and the printed wiring boards are mounted upon the heatsink in a manner to maximize heat transfer to the heatsink. The electrical components may be discrete circuit components such as resistors, capacitors, or discrete semiconductors. They may be integrated circuit chips of various types, or both. Electrical considerations have a significant role in the characteristics of the components and the printed wiring board, but heat transfer is always a consideration. In addition to the printed wiring boards 10 and 12 with their components, FIG. 1 also shows further printed wiring boards attached to opposite sides of the heatsink. The heatsink may be of any convenient material of high thermal conductivity. Thus, a copper or aluminum metallic heatsink may be employed. If maximum thermal conductivity and minimum weight or volume are of significant consideration, then the heatsink is preferably a heat pipe.

Figure 1:
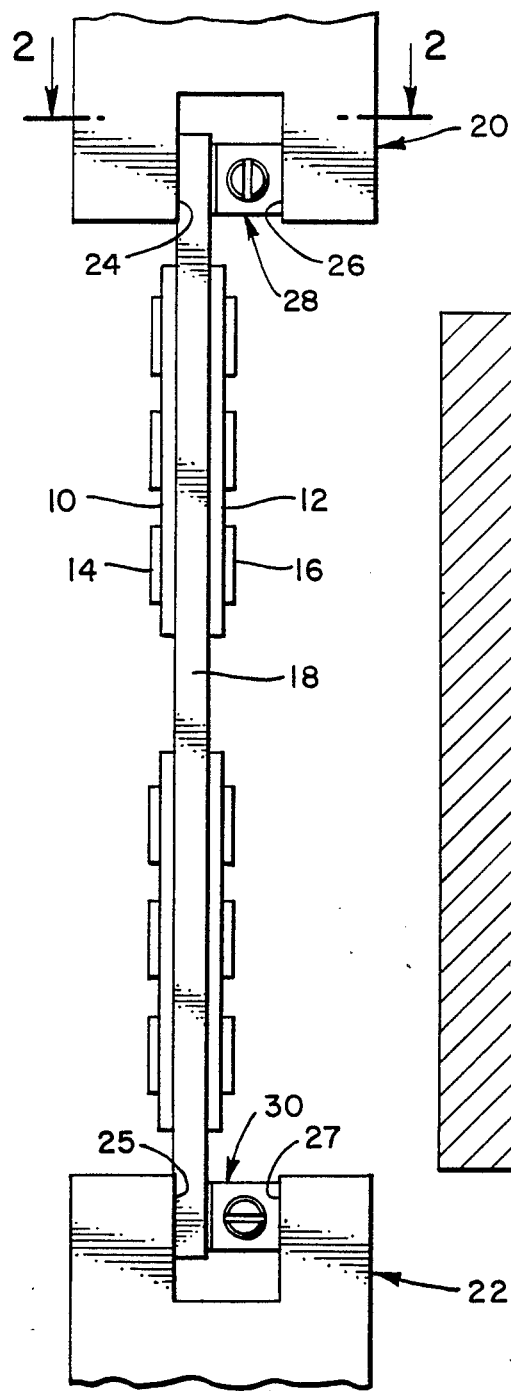
FIG. 1 is a elevational view of a heatsink inserted in channels in two facing coldwalls with two of the wedge clamp thermal connectors of this invention clamping the heatsink into low thermal resistance with respect to the coldwalls.

The electrically generated heat is transferred out of the components in which it is generated, through the printed wiring board into the heatsink 18. In order to cool the heatsink, it is forced into intimate contact to one or more coldwalls. Coldwalls 20 and 22 are indicated in FIG. 1. Two coldwalls are preferred in order to maximize heat flow out of the heatsink, but one may be sufficient in some instances. Referring particularly to the coldwall 20, with the understanding that coldwall 22 is symmetrically identical, the coldwall 20 is provided with a channel defined by opposing faces 24 and 26. The end of the heatsink, beyond the ends of the printed wiring boards, is inserted into the channel defined by these faces. Wedge clamp thermal connector 28 is also inserted into the channel, clamps the heatsink against the face 24, and clamps itself against face 26 of the coldwall. An identical wedge clamp thermal connector 30 clamps the lower edge of the heatsink against the coldwall faces in coldwall 22. The coldwall may be cooled by any convenient means, depending upon the available cooling conditions. A mechanical refrigerator employing expanding gas or vaporizing liquid is preferably thermally connected to both of the coldwalls so that the heat therein is extracted. In this way, a path for the rejection of heat from the electrical components to an outside heat sump is achieved. The wedge clamp thermal connectors 28 and 30 provide the clamping force and the thermal pathway to assure optimized heat transfer from the heatsink to the coldwall.

As is seen in FIGS. 3 and 6, the wedge clamp thermal connector 28 is made up of wedge pieces 32 and 34. Wedge piece 32 has a planar contact face 36 and a planar clamp face 38. The two planar faces intersect at a shallow, acute angle so that the contact face 36 extends the entire length of the wedge piece. Both of the planar faces are perpendicular to the sheet of drawing as the thermal connector 28 is seen in FIGS. 3 and 6. The thicker end of the wedge piece 32 is indicated at 40. Wedge piece 34 is structurally similar and has a contact face 42 and clamp face 44. The contact face 42 and clamp face 44 are planar and intersect each other with the same angle as the angle of wedge piece 32. Thus, when the contact faces 36 and 42 lie against each other, as shown in FIGS. 3 and 6, the clamp faces 38 and 44 are parallel to each other.

Screw-threaded hole 46 extends through the length of wedge piece 32, parallel to the clamp face 38, as seen in FIG. 6. Machine screw 48 is threaded into hole 46. The machine screw has an external head 50 thereon which is configured to be engaged for turning, such as having a screwdriver slot therein. Alternatively, it may have another type of engagement surface, such as a hexagonal Allen recess. In addition to the head, machine screw 48 has a circular thrust collar 52 thereon. To receive the machine screw 48, wedge piece 34 has a slot 54 cut thereon parallel to clamp face 44. This slot is just wide enough to clear the shank of the machine screw, as is seen in FIGS. 4 and 5. The slot 54 is deep enough so that it aligns with screw hole 46 when wedge piece 34 is slid down to the minimum thickness position where the clamp faces 38 and 44 are the same distance apart as the thickness of end 40. In addition, U-shaped groove 56 is cut around the slot near end 58 so that the collar 52 is received therein.

The material of the wedge clamp thermal connector 28 is such as to provide high thermal conductivity. Materials such as copper and aluminum are preferred. In order to maximize conductivity, no metal is removed from the solid wedge pieces, other than is necessary to achieve the mechanical functions. The principal thermal path is between the heatsink 18 and the coldwalls 20 and 22 at the interfaces 24 and 25, respectively, seen in FIG. 1. The interfaces 26 and 27 are secondary, in that the thermal path from the heatsink 18 to the coldwalls 20 and 22 is long with more interfacial thermal impedances. While interfaces 26 and 27 are higher resistance thermal paths, the substantial thermal paths through the clamp provide significant heat flow. The clamps engage the surfaces 26 and 27 to provide the mechanical reaction surface to allow the high clamping forces on the principal thermal interfaces 24 and 25. The majority of heat will pass across these interfaces because of the lower thermal resistance. Thus, maximum area of contact is achieved between contact faces 36 and 42 and the most solid structure is achieved.

Figure 2:
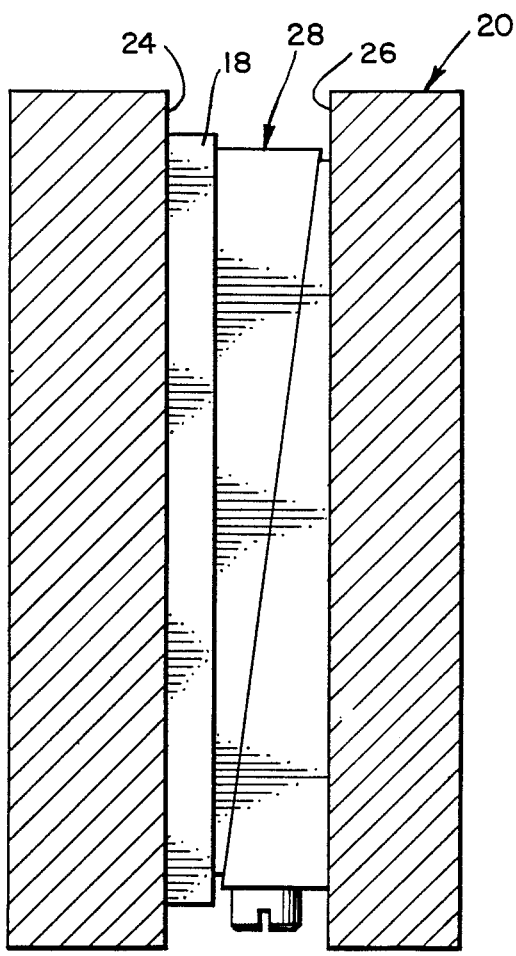
FIG. 2 is an enlarged section taken generally along the line 2—2 showing one of the wedge clamp thermal connectors of this invention.

When the wedge clamp is to be installed, the screw is loosened so as to reduce the distance between clamp faces 38 and 44 such that the wedge clamp thermal connector can be put in place, as shown in FIGS. 1 and 2. Once in place, the screw 48 is tightened to pull the wedge piece 34 upward with respect to the wedge piece 32, as seen in FIGS. 3 and 6. This increases the dimension between clamp faces 38 and 44 so that the heatsink is clamped into the channel in the coldwall. The heatsink is forced against coldwall face 26, and the clamp 28 expands to apply force against heatsink 18 and coldwall face 24 to create a low resistance heat path. The forceful engagement of the thermal connector 28 against the heatsink and coldwall also provides a solid thermal path through the thermal connector 28 to the coldwall face 26. The low angle of the wedges, with the large area joining contact faces extending the entire length of the wedge pieces, maximizes the clamping forces and maximizes the areas in thermal contact. When it is desired to remove the wedge clamp thermal connector 28, screw 50 can be turned in the opposite direction and the collar 52 engaging in the groove 56 pulls the wedges apart to permit easy removal of the wedge clamp thermal connector. In this way, firm clamping and high thermal conductivity is achieved.

This invention has been described in its presently contemplated best mode, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A wedge clamp thermal connector comprising:

first and second wedge pieces, said first and second wedge pieces each being defined by a large end and a small end, and being defined by a contact face and a clamp face, said contact face and said clamp face of each of said wedge pieces being substantially planar and being at an acute angle from each other and extending from said small end to said large end, said acute angle on said first wedge piece being substantially the same as the acute angle on said second wedge piece so that when said wedge pieces lie together with said contact faces lying together and said large end of said first wedge piece lying adjacent said small end of said second wedge piece, said clamp faces are substantially parallel, wherein said first and second wedge pieces are metallic and are solid except for accommodation of said screw so that said wedge clamp also serves as a thermal connector between the heatsink and the coldwall;

a screw lying substantially parallel to said clamp faces and engaging both said first and second wedge pieces so that operation of said screw moves said large ends of said wedge pieces so that operation of said screw moves said large ends of said wedge pieces towards each other to increase the distance across said clamp faces so that said wedge clamp thermal connector can clamp a heatsink against a coldwall to enhance thermal conduction between the heatsink and the coldwall;

said first wedge piece has a threaded opening therein extending from said contact face towards said large end substantially parallel to said clamp face, said threaded opening being sized to threadedly receive said screw;

said second wedge piece having a U-shaped slot therein extending from said large end of said second wedge piece substantially parallel to said clamp face and extending to said contact face to receive a portion of said machine screw; and said machine screw has a collar thereon and there is a U-shaped groove in said second wedge piece to receive said collar so that said screw is axially positioned with respect to said second wedge piece to move said second wedge piece with respect to said first wedge piece in either direction by rotation of said screw.

2. The wedge clamp thermal connector of claim 1 wherein:

said machine screw has a head thereon and said head engages against said large end of said second wedge piece.

3. The wedge clamp thermal connector of claim 1 wherein:
said machine screw has a head thereon and said head engages against said large end of said second wedge piece.

4. A wedge clamp thermal connector comprising:
a first wedge piece, said first wedge piece being made of metal and being defined by a large end, a small end, a clamp face extending from said large end to said small end, and a contact face extending from said large end to said small end, said contact face lying at an acute angle with respect to said clamp face, a threaded opening in said first wedge piece extending from said contact face, substantially parallel to said clamp face and towards said large end;
a second wedge piece made of metal, said second wedge piece being defined by a large end, a small end, a clamp face extending from said large end to said small end, and a contact face extending from said large end to said small end, said contact face lying at an acute angle with respect to said clamp face;
said contact faces and said clamp faces on both said wedge pieces being substantially planar, said acute angle of said first wedge piece being substantially the same as said acute angle of said second wedge piece so that when said contact faces lie together, said clamp faces are substantially parallel;
said second wedge piece having a slot therein extending from said large end, substantially parallel to said clamp face and extending to said contact face, said slot being positioned to be in line with said threaded opening in said first wedge piece when said contact faces are lying against each other, wherein there is a U-shaped groove in said slot in said second wedge piece adjacent said large end thereof and there is a collar on said machine screw, said collar lying within said U-shaped groove so that rotation of said screw in either direction causes motion of said second wedge piece with respect to said first wedge piece to control the dimension across said clamp faces;
a machine screw lying in said slot in said second wedge piece and engaging said second wedge piece and being threadedly engaged in said threaded opening in said first wedge piece so that tightening of said screw moves said large ends towards each other to increase the distance between said clamp faces so that said wedge clamp thermal connector can be engaged.

5. The wedge clamp thermal connector of claim 4 wherein said first wedge piece is solid except for said threaded opening therethrough and said second wedge piece is solid except for said slot and said U-shaped groove therein to accommodate said machine screw so that maximum material is retained in said wedge clamp thermal connector to enhance thermal conductivity through said wedge clamp thermal connector.

6. The wedge clamp thermal connector of claim 5 wherein said machine screw has engagement means thereon for external engagement with said machine screw to rotate said machine screw with respect said first and second wedge pieces.

7. The wedge clamp thermal connector of claim 6 further including in combination a coldwall having first and second faces therein, said first and second faces facing each other and defining a channel, a heatsink extending into said channel, said heatsink lying against said first face, said wedge clamp having its first face lying against said second face and lying against said heatsink to force said heatsink against said first face and force said wedge clamp against said second face to enhance thermal conductivity between said heatsink and said coldwall both directly and through said wedge clamp thermal connector.

8. The wedge clamp thermal connector of claim 4 further including in combination a coldwall having first and second faces therein, said first and second faces facing each other and defining a channel, a heatsink extending into said channel, said heatsink lying against said first face, said wedge clamp having its first face lying against said second face and lying against said heatsink to force said heatsink against said first face and force said wedge clamp against said second face to enhance thermal conductivity between said heatsink and said coldwall both directly and through said wedge clamp thermal connector.

* * * * *